US010424961B1

(12) United States Patent
Maluf et al.

(10) Patent No.: US 10,424,961 B1
(45) Date of Patent: Sep. 24, 2019

(54) USER IDENTIFICATION FROM BATTERY CHARACTERISTICS

(71) Applicant: Qnovo Inc., Newark, CA (US)

(72) Inventors: Nadim Maluf, Los Altos, CA (US); Fred Berkowitz, Los Gatos, CA (US)

(73) Assignee: Qnovo Inc., Newark, CA (US)

( * ) Notice: Subject to any disclaimer, the term of this patent is extended or adjusted under 35 U.S.C. 154(b) by 164 days.

(21) Appl. No.: 15/476,300

(22) Filed: Mar. 31, 2017

Related U.S. Application Data

(60) Provisional application No. 62/318,095, filed on Apr. 4, 2016.

(51) Int. Cl.
*G01R 31/00* (2006.01)
*H02J 7/00* (2006.01)
*G01R 31/378* (2019.01)
*G01R 31/392* (2019.01)

(52) U.S. Cl.
CPC ............ *H02J 7/007* (2013.01); *G01R 31/378* (2019.01); *G01R 31/392* (2019.01); *H02J 2007/0001* (2013.01)

(58) Field of Classification Search
USPC .................................................. 324/426–438
See application file for complete search history.

(56) References Cited

U.S. PATENT DOCUMENTS

| 6,016,047 | A | * | 1/2000 | Notten | G01R 31/3651 320/128 |
| 7,999,505 | B2 | * | 8/2011 | Bertness | G01R 31/36 320/104 |
| 8,805,764 | B1 | * | 8/2014 | Rhines | G06N 5/02 706/46 |
| 2011/0241824 | A1 | * | 10/2011 | Uesugi | B60L 53/65 340/5.8 |
| 2016/0047861 | A1 | * | 2/2016 | Chen | G01R 31/3606 361/78 |

* cited by examiner

*Primary Examiner* — Vincent Q Nguyen
(74) *Attorney, Agent, or Firm* — Weaver Austin Villeneuve & Sampson LLP

(57) ABSTRACT

Disclosed is a method for identifying a battery type and/or a battery user. Measuring circuitry may be used to collect battery parameters that may be analyzed by control circuitry to create an adaptive charge profile that is applied to a battery by charging circuitry. Battery parameters may be recorded in a battery use signature. Logic may be used to process a battery use signature and identify a single user across multiple battery operated devices and/or discriminate between multiple users of a device. In some cases, battery use signature may be used to identify battery information including the make, model, and lot from which the battery was manufactured.

23 Claims, 10 Drawing Sheets

FIGURE 6A
FIGURE 6B
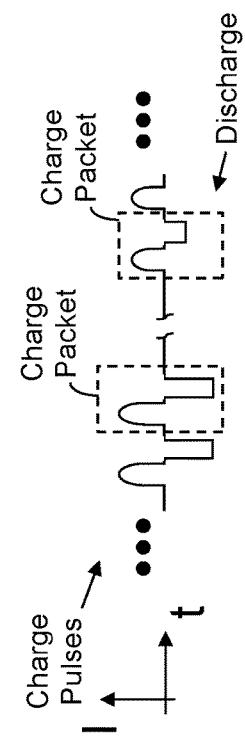
FIGURE 6C
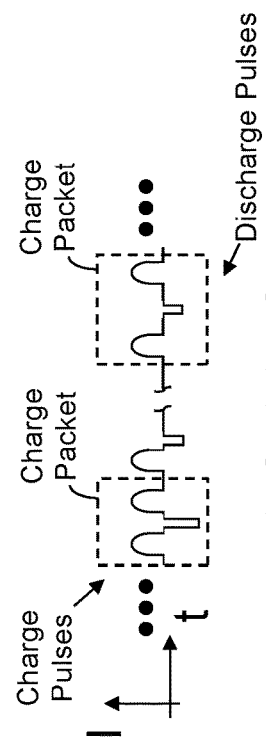
FIGURE 6D
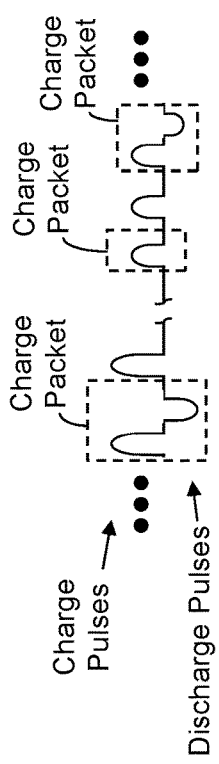
FIGURE 6E

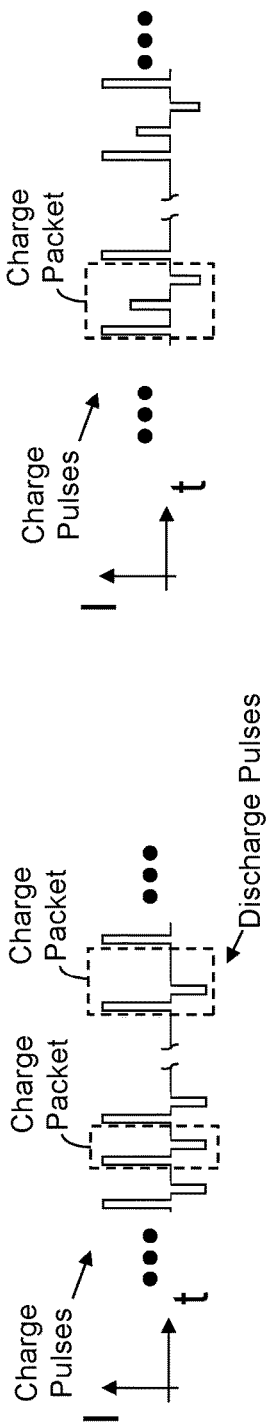
FIGURE 6F
FIGURE 6G
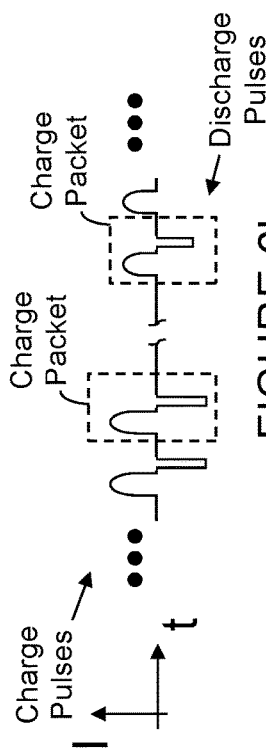
FIGURE 6H
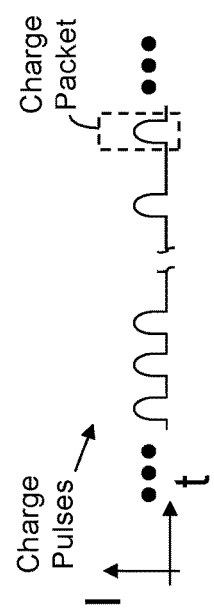
FIGURE 6I
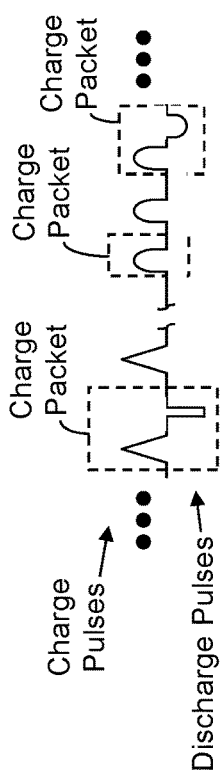
FIGURE 6J

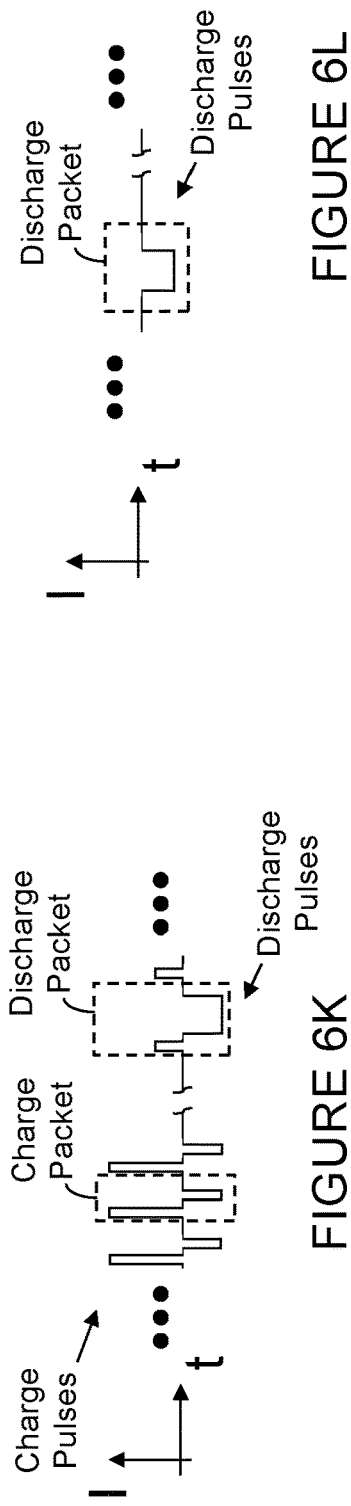
FIGURE 6K
FIGURE 6L
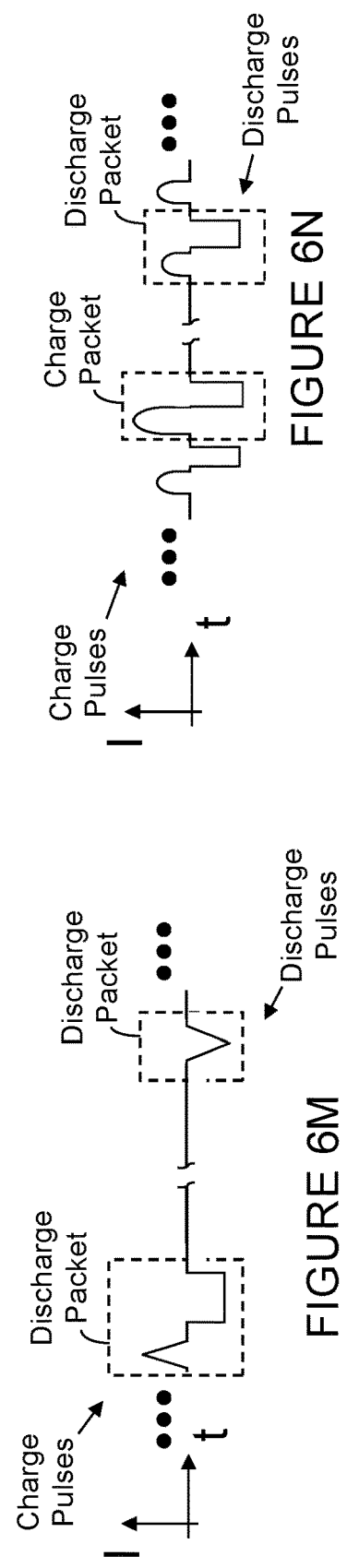
FIGURE 6M
FIGURE 6N

USER IDENTIFICATION FROM BATTERY CHARACTERISTICS

CROSS-REFERENCE TO RELATED APPLICATION

This application claims the benefit of U.S. Provisional Patent Application No. 62/318,095, filed Apr. 4, 2016 and titled USER IDENTIFICATION FROM BATTERY CHARACTERISTICS, which is incorporated herein by reference in its entirety and for all purposes.

BACKGROUND

Batteries and associated charging circuitry are widely deployed in electronic devices such as smartphones, power tools, and computers. Many such devices are purchased by users and used on a regular basis, sometimes daily. Batteries, particularly rechargeable batteries, and associated control logic have been engineered to facilitate efficient charging, high capacity, and long life. However, modern advanced control logic may be underutilized in various contexts.

SUMMARY

A method for identifying a battery type and/or battery user is described. Charging circuitry, measuring circuitry, and control circuitry are used to collect various battery parameters which are analyzed and recorded in a battery use signature. A battery use signature acts as a digital fingerprint from which logic can be used to identify a single user across multiple battery operated devices or discriminate between multiple users of a device. A battery use signature can also be used to identify battery information including the make, model, and lot from which the battery was manufactured.

Parameters which are incorporated in the battery use signature include parameters collected during an adaptive charge process as well as during battery use or discharge. Parameters collected during the adaptive charging process may include measurements such as the charge pulse voltage, charge pulse voltage range, overpotential, full relaxation time, partial relaxation time, full charge capacity, projected capacity, charge event information, time in service, and state of health information, and battery temperature. Parameters collected during battery discharge include but are not limited to current, battery voltage, and battery temperature. These parameters are recorded, often with their time of measurement, to provide a substantially comprehensive data set of the battery performance and use.

Identifying a user or battery type can have many uses. For example, identification can be used to create an adaptive charging profile that optimizes a battery's cycle life, and/or charge speed for a particular user. Alternatively, identification can be used to detect fraudulent warrant claims of a device or detect criminal activity pertaining to a battery operated device.

In one aspect of the present disclosure, a method is provided for identifying a user of a battery or an electronic device powered by a battery, where the method includes (a) identifying multiple battery parameter values representing characteristics of a battery under the control of battery control logic in an electronic device or a component associated with the electronic device, and (b) analyzing the battery parameter values identified in (a) to identify a user of the device or the battery, and/or discriminate between two or more putative users of the device or the battery.

In some embodiments, identified parameter values include the number, frequency, load, and/or time stamps of charge cycles for a given battery/cell. In some cases, identified parameter values include a state of charge history for the battery, a temperature corresponding to the battery or external environment, a capacity of a battery/cell identified as a function of time, or a state of health value of the battery.

In some embodiments, identifying multiple battery parameter values includes measuring a battery terminal voltage over time, and, from the battery terminal voltage, calculating one or more of the following parameters: charge pulse voltage, overpotential, voltage response shape due to a charge or discharge pulse, full relaxation time, partial relaxation time, and equilibrium voltage measurements. In some cases, identifying multiple battery parameter values may include measuring the current applied and/or the total charge passed to the battery, capturing parameter values at a time after a battery's initial use of at least about 10 charge cycles, or capturing parameter values during each new charge cycle. In some embodiments, battery parameter values are identified to create an adaptive charging profile to optimize a battery's cycle life and/or charge speed.

In some embodiments, a battery use signature is generated by analyzing identified battery parameter values. A battery use signature may include data representing a history of captured battery parameters. In some embodiments, a battery use signature may be used to detect fraudulent warranty claims pertaining to the electronic device, and/or to detect criminal activity pertaining to use of the electronic device. In some embodiments, one or more of the battery parameter values may be used to inform the user of the battery's state of health and/or to predict a charge time of the battery.

In some embodiments, a method for identifying a user of a battery or an electronic device powered by a battery may also include analyzing at least one non-battery parameter. Examples of non-battery parameters include an international mobile station equipment identity, location data provided by the electronic device, sensed information provided by the electronic device, and personalized information provided by the user of a remote device.

In some embodiments, a battery type may be identified by comparing multiple battery parameter values to a database providing ranges of battery parameter values for a plurality of battery types. In some embodiments, analyzing battery parameters may include discriminating between an original battery and a replacement battery, or identifying one or more patterns indicating user behavior. Patterns in user behavior may include analysis of when charging occurs, the state of charge when charging is initiated, or the state of charge at which charging is stopped.

In another aspect of the present disclosure, an apparatus is described that charges or monitors a battery having two terminals. The apparatus includes (a) charging circuitry, coupled to the battery that may apply current to the battery during a charge process; (b) measuring circuitry, coupled to the battery, that can measure a voltage at the terminals of the battery; and (c) control circuitry, coupled to the charging circuitry and the measuring circuitry, that (i) receives data which is representative of the measured voltage, and (ii) outputs one or more control signals to the charging circuitry. The control circuitry may also identify multiple battery parameter values representing characteristics of a battery under the control of battery control logic in an electronic device or a component associated with the electronic device and/or analyze the battery parameter values identified in (a)

to identify a user of the device or the battery, and/or discriminate between two or more putative users of the device or the battery.

In some embodiments, measuring circuitry may measure a current delivered to the battery and/or a current delivered by the battery. In some embodiments, measuring circuitry further includes a temperature sensor thermally coupled to the battery.

In some embodiments, the control circuitry generates one or more control signals to adapt one or more characteristics of a charge packet to determine a battery's state of charge, state of health, and/or to adjust battery charging parameters. Control circuitry may also generate the one or more control signals to adapt one or more characteristics of a charge packet by adjusting the amplitude of charge pulses or the amplitude of discharge pulses and/or adjusting the period of the charge pulses, the discharge pulse, or rest periods.

In some embodiments, the control circuitry and the battery may both be housed in an electronic device. In some cases, the battery is housed in an electronic device and the control circuitry is housed elsewhere. In some embodiments, the apparatus is equipped with memory for storing the identified parameters. In some embodiments, control circuitry may operate on a remote server or on a cloud-based application. In some cases, control circuitry may store the identified battery parameter values on a remote server. In some cases, control circuitry algorithms may be updated by the user. The apparatus and methods for identifying a user and/or battery type will be described in further detail below with reference to the associated drawings.

BRIEF DESCRIPTION OF THE DRAWINGS

In the course of the descriptions to follow, reference will be made to the attached drawings. These drawings show different aspects of some implementations, and where appropriate, reference numerals illustrating like structures, components, materials and/or elements in different figures are labeled similarly. It is understood that various combinations of the structures, components, and/or elements, other than those specifically shown, are contemplated and are within the scope of the present disclosure.

The present disclosures are neither limited to any single aspect nor embodiment thereof, nor to any combinations and/or permutations of such aspects and/or embodiments. Moreover, each of the aspects of the present disclosures, and/or embodiments thereof, may be employed alone or in combination with one or more of the other aspects of the present disclosures and/or embodiments thereof. For the sake of brevity, certain permutations and combinations are not discussed and/or illustrated separately herein.

FIGS. 6A-6N illustrate exemplary charge and/or discharge packets of the charging and discharging signals (which are exemplarily illustrated in FIGS. 5A-5D), wherein such charge and discharge packets may include one or more charge pulses and one or more discharge pulses; notably, in one embodiment, each charge signal of FIGS. 5A-5D may include a plurality of packets (for example, about 100 to about 50,000 packets) and, in one embodiment, each packet may include a plurality of charge pulses, discharge pulses and rest periods; notably, the pulses may be any shape (for example, rectangular, triangle, sinusoidal or square); in one exemplary embodiment, the charge and/or discharge pulses of the packet may include a temporal duration of between about 1 ms to about 500 ms, and preferably less than 50 ms; moreover one, some or all of the characteristics of the charge and discharge pulses (for example, pulse amplitude, pulse width/duration and pulse shape) are programmable and/or controllable via charging circuitry wherein the amplitude of the positive and/or negative pulses may vary within the packet (and are programmable and/or controllable), the duration and/or timing of the rest periods may vary within the packet (and are programmable and/or controllable) and/or, in addition, such pulses may be equally or unequally spaced within the packet; the combination of charging pulses, discharging pulses and rest periods may be repetitive and thereby forms a packet that may be repeated; all combination or permutations of pulse, pulse characteristics, periods, packets and signal characteristics and configurations are intended to fall within the scope of the present disclosures.

DETAILED DESCRIPTION

Introduction

Figure 1:
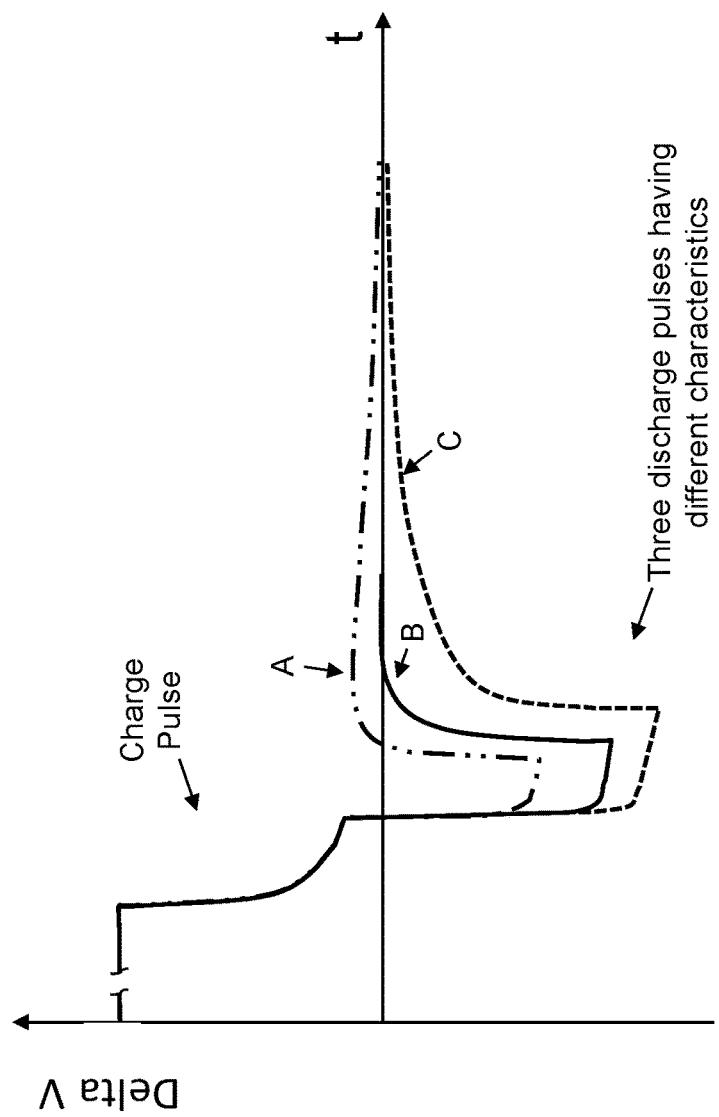
FIG. 1 is an illustration depicting three responses to a charge packet having a charge pulse (which injects charge into the battery) and a discharge pulse (which removes charge from the battery) wherein a first response (A) includes a significant "overshoot" whereby the discharge pulse removed too little charge from the battery, a second response (B) that include no significant "overshoot" or "undershoot" wherein the discharge pulse removes a suitable amount of charge which provides the fastest partial relaxation time of the three responses, and a third response (C) includes a significant "undershoot" whereby the discharge pulse removed is too much charge from the battery.

In this disclosure, combinations of certain battery parameter values are used to identify a user and/or battery type associated with an electronic device. In some cases, many battery parameters—e.g., two or more, or five or more—are employed to uniquely identify a user and/or battery type. The identifying parameter values are referred to as a battery use signature. Examples of some battery parameters that may uniquely identify an individual include operating temperatures, partial relaxation times during charge, and timestamps for charge initiation.

In many implementations, battery systems are designed or adapted to capture the necessary parameter values. These systems may be additionally responsible for charging and/or monitoring a rechargeable battery or device.

Definitions

The term "battery" as used herein refers to one or more galvanic cells (each of which stores energy electrochemically). A battery may be an individual cell and/or a plurality of cells arranged electrically in a series and/or parallel configuration. Although some technical materials describe a battery as including two or more cells, the term "battery" is not so limited in this disclosure. In some implementations, a battery can be a single cell or multiple cells connected together in series or parallel to provide a desired voltage or current rating. A battery may be rechargeable (a secondary battery) or non-rechargeable (a primary battery).

"Battery type" distinguishes classes or groups of batteries from one another. Among the factors that identify a battery type are (i) battery chemistry (e.g., lithium-ion ($Li^+$) batteries and nickel metal hydride batteries), (ii) battery format (e.g., cylindrical versus prismatic versus pouch) and size (e.g., 18650 versus AA), (iii) manufacturer identity (e.g., Samsung versus Panasonic), (iv) manufacturing process, and (v) the manufacture process implementation (e.g. lot, plant, and/or site). An example of a battery type is an 18650 format rechargeable lithium-ion battery produced by a particular manufacturer (e.g., Samsung, LG, Sony, etc.) produced in a particular lot using a particular process of the manufacturer.

"Battery parameters" refer to parameters of, or associated with, a battery and its use. The battery parameters most relevant to this disclosure are those used in defining a battery use signature. Values of battery parameters are often captured by battery control logic such as the logic used in a battery charger. Examples of types of battery parameters include charge pulse voltage, charge pulse voltage reference, partial relaxation time, time in service for the battery (e.g., from the time it was installed in the device it powers or when it was first used), charge event information, discharge event information, full charge capacity, and projected capacity (typically to some number of cycles, and combinations of conditions known to be detrimental (e.g., the battery is in a fully charged state and exposed to a high temperature)). The values of each of these parameters may vary as a function of the state of charge during the charge portion of a single battery cycle. The parameters values may also vary from cycle-to-cycle over the battery's life.

"Battery use signature" (also referred to as a use signature, or just signature) is a term that refers to a representation of the use and performance of a battery at one or more times throughout its lifetime. Such signature may be provided as a scalar, a vector, a matrix, or other representation of underlying information, which information may be collected from a battery's charging and/or monitoring logic. The information may be provided as a simple collection of data and/or manipulated to provide a reduced form such as a scalar or vector. In some cases, the battery use signature directly represents or is correlated with a particular user, a particular battery, a particular electronic device (using a battery), and/or any combination of these. Signature information may be derived from information on how a user tends to use his or her device. For example, a signature may be derived from the number of charge cycles, the frequency of charge cycles, the amount of charge passed during charge cycles, the timing of charge cycles, the state of charge history, and battery temperature information. The signature may also be derived from information related to the battery's performance. For example, a signature may be derived from a history of a battery's capacity, steady state voltage, charge pulse voltage, and relaxation response as a function of charge and discharge pulses. Thus, a battery use signature may represent a history of a battery's use. On the other hand, some battery use signatures may represent a snapshot of a battery's use, as for example at a particular time, a particular charge cycle, or a particular group of charge cycles. In some implementations, a battery use signature is able to discriminate between two possible users of a battery or to uniquely identify a user, either without or without also considering the battery type.

"Battery Control Logic" refers to the control algorithms and/or rules that are used for determining charging parameters (for example, the amplitude, width, and frequency of charge and discharge pulses) in the charge process. In some embodiments, the algorithms or rules are chosen to improve or balance a battery's cycle life and/or charge speed. Battery control logic may make use of state of health (SOH) information and/or battery feedback measurements that may include the state of charge (SOC), temperature, voltage, and the voltage response shape due to charging and discharging pulses. In certain embodiments, battery control logic is implemented as executable instructions or code stored in hardware (e.g., any of various forms of memory), firmware, or software. The battery control logic may also be considered to include one or more processors configured or designed to execute the instructions or code, particularly when such processors are directly linked to the memory or other storage providing the instructions or code. Unless otherwise stated, the terms battery control circuitry and control circuitry are equivalent to battery control logic.

"Charge Process" refers to a process in which a battery is charged from a state of less charge to a state of more charge. During a charge process, the battery's state of charge increases. A charge process may be conducted under the control of charging circuitry which may be part of the battery control logic. In certain embodiments, charging circuitry adapts, adjusts and/or controls the amplitude, pulse width, or duty cycle of charging or discharging pulses in order to control or adjust a feature of the battery such as the battery's relaxation time, rate, shape and/or characteristics of the decay of the terminal voltage of the battery. For example, with reference to FIG. 1, charging circuitry may adapt, adjust and/or control the amplitude and pulse width of the discharge pulse to reduce or minimize the "overshoot" or "undershoot" of the decay of the terminal voltage of the battery.

A "charge cycle" is the process of charging a rechargeable battery and discharging it with a particular load. In some implementations, a charge cycle means charging and discharging an amount of charge that is equivalent to the battery's capacity but not necessarily by one full charge and one full discharge. For instance, using half the charge of a fully charged battery, recharging it, and then using the same amount of charge again count as one charge cycle. The number of charge cycles to failure indicates how many times a rechargeable battery can undergo the process of complete charging and discharging until failing certain criteria. The number of charge cycles may be used to specify a battery's expected life, which may affect battery life more than the mere passage of time.

"Capacity" or nominal capacity refers to the total Amp-hours available when the battery is discharged at a certain discharge current (which may be specified as a C-rate) from 100 percent state-of-charge to a defined cut-off voltage. A battery's capacity may change over multiple charge cycles. In conventional batteries, it is not uncommon for the battery's capacity to decrease of "fade" over multiple cycles.

The term "capacity fade" refers to the reduction of battery capacity over time or charge cycles. It may be based on a maximum of the battery capacity or other reference values of battery capacity (e.g., 85% of initial maximum capacity, capacity at specific terminal voltage, etc.)

Terminal voltage is the voltage between the battery terminals. The terminal voltage may vary with the state of charge and discharge or charge current. The terminal voltage may be measured with or without current flowing through a load. In the latter case, the terminal voltage is an open circuit voltage.

"State of charge" (SOC) may refer to the present battery capacity as a percentage of maximum capacity. SOC is used to characterize how far a battery in use has progressed between a fully charged state and a discharged state. State of charge may be calculated using current integration to determine the change in battery capacity over time or charge cycles.

The "state of health" (SOH) of a battery is a parameter that characterizes the "age" of the battery and/or ability of the battery to hold charge, for example, relative to a given time in operation (for example, the initial time in operation). The SOH of a battery provides information to estimate, calculate, measure, and/or determine other battery parameters such as the ability of a battery to hold a charge. The voltage at the terminals of the battery at a given SOC changes as the SOH changes, and hence the voltage curve (voltage versus state of charge) of the battery shifts as it ages and its SOH deteriorates. The state of health parameter is further described in U.S. Pat. No. 9,121,910, issued Sep. 1, 2015, which is incorporated herein by reference in its entirety.

An "electronic device" as indicated herein refers to a device that performs any number of tasks or functions electrically and can be powered by a battery. The device may or may not physically include (e.g., enclose or attach) the battery or control logic described herein. Electronic devices may be portable or fixed. Examples of electronic devices include mobile phones, digital cameras, laptops, portable speakers, battery powered vehicles, systems for storing solar and other home generated electrical energy, and power tools.

"Measuring," "collecting," or "capturing" a parameter as stated herein is a way of obtaining a value of the parameter. For instance, measuring the voltage of a battery can mean using an instrument such as a voltmeter to measure the voltage between terminals of the battery directly. In some contexts, it means obtaining parameter values related to raw measurements of the battery and/or deriving other information about the battery (e.g., partial relaxation, battery swelling, etc.). Typical raw measurements of a battery may include current, charge passed or coulombs injected into the battery, voltage, and temperature.

Determining a "relationship" as used herein refers to determining a relationship between one or more input variables (independent variables) and one or more output variables (dependent variable). For example, a user identity may be dependent on a combination of multiple battery parameter values. The user identity is an output variable, and the battery parameter values are input variables. In some implementations, the relationship includes a mathematical function relating one or more input variables to an output variable. In some implementations, the relationship includes a univariate or a multi-variate model using one or more input variables to predict one or more output variables. In other implementations, the relationship may be implemented as a lookup table containing values for one or more input variables and corresponding values for one or more output variables. The relationship may be simply a correlation between the one or more input variables and one or more output variables. As examples, a relationship may be determined by performing a regression on the variables.

Numeric ranges are inclusive of the numbers defining the range. It is intended that every maximum numerical limitation given throughout this specification includes every lower numerical limitation, as if such lower numerical limitations were expressly written herein. Every minimum numerical limitation given throughout this specification will include every higher numerical limitation, as if such higher numerical limitations were expressly written herein. Every numerical range given throughout this specification will include every narrower numerical range that falls within such broader numerical range, as if such narrower numerical ranges were all expressly written herein.

The headings provided herein are not intended to limit the disclosure.

Unless defined otherwise herein, all technical and scientific terms used herein have the same meaning as commonly understood by one of ordinary skill in the art. Various scientific dictionaries that include the terms included herein are well-known and available to those in the art. Although any methods and materials similar or equivalent to those described herein find use in the practice or testing of the implementations disclosed herein, some methods and materials are described.

As used herein, the singular terms "a," "an," and "the" include the plural reference unless the context clearly indicates otherwise.

The logical connector "or" as used herein is inclusive unless specified otherwise. As such, condition "A or B" is satisfied by "A and B" unless specified otherwise.

Battery Use Signature

A. User Identification Alone, without Connection to Battery Type

In certain embodiments, a battery use signature uniquely identifies a user of a device. The user's device usage pattern uniquely imprints on the battery and the logic used to charge and/or monitor the battery. In such embodiments, the user may be uniquely identified without needing to know the type of battery used. In this implementation, two different batteries, of different battery types, used by the same user will provide a sufficiently similar signature that the same user can be identified as using each of the two batteries. For example, a signature 1 produced by user 1 for battery type 1 and signature 2 produced by user 1 for battery type 2 are identified as belonging to the same user, user 1.

In some implementations, the methods and systems disclosed here do not uniquely identify the battery user from among all other potential battery users, but instead merely identify certain characteristics of the battery user such as the climate or time zone where the user used the device. For example, temperature and timestamps for charge and discharge events can narrow the user's geographic location. In another example, the average SOC or a range of SOCs at which the battery charge is initiated may indicate at what SOC a user favors charging their device. In another example, not related to mobile devices but rather electrical vehicles, recurring patterns of charge and discharge events may also indicate behavior patterns of a user, for example, whether a user of an electric vehicle is a daily commuter with regular work hours. In this example, a commuter drives a predetermined distance and a driving pattern that reflects how current is drained from the battery, and from what starting SOC and ending SOC are used for charging.

B. Battery Type Alone, without Connection to a User

In certain embodiments, a battery use signature uniquely identifies a battery type without regard for a user's use of such battery. Examples of battery types are lithium-ion batteries produced by a particular manufacturer (e.g., Samsung, LG, Sony, etc.), the manufacturing lot of a manufacturer, design (e.g., an 18650 format battery produced using a particular process design), and the like. Using adaptive charging as described herein a unique charge process ID or profile is imprinted. Battery use signature information pertaining to the charge process (e.g., the range of charge and discharge currents and the frequency of adjustments) can be used to determine what manufacturer and manufacture's model of battery is used. For example, it has been observed that many battery families have a unique type of charge profile, including, for example, the minimum and maximum current and the frequency of adaptive charging adjustments specifically indicates what particular model battery of a particular manufacturer is being used. In some cases, a battery type may be identified by comparing battery use signature information to a database that correlates various battery types with expected ranges of battery parameter values.

C. User and Battery Type

In some implementations, a user need not be uniquely identified. Rather, the combination of a user and the battery type used by the user is uniquely identified. In such implementations, a first user using a first battery type produces a use signature that is quantitatively distinct from the first user using a second battery type, but the signature does not uniquely identify the first user.

While the remaining specification focuses on identifying users, it should be understood that the techniques disclosed in the specification can be applied equally to identifying battery types and combinations of user and battery types.

Parameters for Generating Battery Use Signatures

A. Purpose for Collecting Battery Parameters

In certain embodiments, one or more battery parameters available to generate a battery use signature are captured by the battery control logic for purposes other than (or in addition to) generating the signature. For example, one or more parameter values may be captured for the purpose of monitoring and/or controlling a battery charging process (adaptive charging). For instance, captured battery parameters may be used to predict the amount of time required to charge a battery. Alternatively or in addition, one or more these parameters may be captured for the purpose of analyzing a battery's performance and/or predicting future performance (analytics).

1. Adaptive Charging—

Adaptive charging parameter values are captured and used to control or adjust a battery's charging process, typically to optimize the battery's cycle life and/or charge speed. Adaptive charging is described in various other patents and applications assigned to Qnovo Inc. of Newark, Calif. Examples of such patents include U.S. Pat. No. 9,121,910 issued Sep. 1, 2015, U.S. Pat. No. 9,142,994 issued Sep. 22, 2015, U.S. Pat. No. 9,035,623 issued May 19, 2015, and U.S. Pat. No. 8,907,631 issued Dec. 9, 2014, which are incorporated herein by reference in their entireties. Examples of parameters sometimes collected and used for adaptive charging include charge pulse voltage, charge pulse voltage reference, and partial relaxation time. The values of each of these parameters may vary as a function of the state of charge during the charge portion of a single battery cycle. The parameters values may also vary from cycle-to-cycle over the battery's life.

As an example, with reference to FIG. 1, charging circuitry may adapt, adjust and/or control the amplitude and pulse width of the discharge pulse to reduce or minimize the "overshoot" or "undershoot" of the decay of the terminal voltage of the battery. In this regard, where the charge process provides an "overshoot" of the decay of the terminal voltage of the battery relative to partial equilibrium (see discharge pulse A), control circuitry may instruct charging circuitry to adjust the characteristics of the discharge pulse and increase the amount of charge removed by the discharge pulse (for example, via increasing the amplitude and/or pulse width of the discharge pulse). Where, however, the charge process provides an "undershoot" of the decay of the terminal voltage of the battery relative to partial equilibrium (see discharge pulse C), control circuitry may instruct charging circuitry to decrease the amount of charge removed by the discharge pulse (for example, via decreasing the amplitude and/or pulse width of the discharge pulse). As such, control circuitry may adjust the characteristics of the discharge pulse of a subsequent charge packet (for example, the amplitude, pulse width and/or pulse shape) to control or adjust rate, shape and/or characteristics of the decay of the terminal voltage of the battery. In this way, the relaxation time of the battery, and the rate, shape and/or characteristics of the decay of the terminal voltage of the battery, correlates to the characteristics of subsequent charge packets and/or the charge pulse voltage is within a predetermined range and/or less than a predetermined value.

2. Analytics

Analytics parameter values are captured and analyzed to determine a battery's current and/or future condition such as the battery's current state of health, predicted lifespan, future swelling, etc. Battery analytics is described in various other patents and applications assigned to Qnovo Inc. Examples of such patents include U.S. Pat. No. 8,638,070 issued Jan. 28, 2014, U.S. Pat. No. 8,791,669 issued Jul. 29, 2014, U.S. Pat. No. 8,970,178 issued Mar. 3, 2015, and U.S. Pat. No. 9,063,018 issued Jun. 23, 2015, which are incorporated herein by reference in their entireties. Examples of parameters sometimes collected and used for analytics include time in service for the battery (e.g., from the time it was installed in the device it powers or when it was first used), charge event information, discharge event information, full charge capacity, projected capacity (typically to some number of cycles), and combinations of conditions known to be detrimental (e.g., the battery is in a fully charged state and exposed to a high temperature). The values of each of these may vary from cycle-to-cycle over the battery's life.

The following table lists some battery parameters and their applications other than identifying users.

| Adaptive Charging Parameters (@ each cycle) | Analytics Parameters (@ each cycle) |
|---|---|
| Charge Pulse Voltage vs. State of Charge | Projected Capacity (full charge) at a future cycle |
| Partial Relaxation Time vs. State of Charge | Current Capacity (full charge) |
| CPV reference (or range) vs. State of Charge | Charge Event Information Discharge Event Information Time in Service (battery) |

B. When Battery Parameter Values are Collected

For a battery use signature to reliably identify a particular user, the user's use pattern should be imprinted on the battery and/or the battery control logic that captures and/or accesses the relevant parameter values. Imprinting the use pattern takes time, sometimes days, weeks, or months of regular or intermittent use. Depending on the requirements for the use signature, the needed battery parameter values may be captured at various times during a battery's life.

1. In some case, the battery parameter values are collected as a snapshot taken at some time after a battery's purchase or initial use, when the user's behavior has made an impact on the battery parameter values. To prepare a useful battery use signature may require at least one snapshot of the battery parameter values. The snapshot may be taken days, weeks, months, or even years after the user begins using the equipment powered by the battery. In some cases, the snapshot for a use signature is taken after at least about ten cycles, or at least about twenty cycles, or at least about thirty cycles, or at least about forty cycles, or at least about fifty cycles, or at least about seventy-five cycles, or at least about one hundred cycles.

2. In certain embodiments, the parameter values are captured repeatedly, such as during each new charge cycle (e.g., when charge current is initially applied, when charge is complete, or when discharge reaches a particular level). While one or a few snapshots may be sufficient to identify a user in some cases, more data may be required in other cases. For example, new parameter values may be captured during every charge cycle, or during every other charge cycle, or during every three charge cycles, or during every five charge cycles, or during every ten charge cycles, etc.

C. Precision of Measured Battery Parameter Values

To record a battery use signature capable of distinguishing between users and/or battery type it may be necessary to accurately and precisely record battery parameter values. In some embodiments, a temperature is measured to a precision within about 1 degree Celsius. In certain embodiments, voltage is measured to a precision of within about 0.5 mV to 2 mV, or about 0.05% to 0.2% of the voltage range from full charge to full discharge. In some embodiments, current is measured to a precision of within about 5-50 mA, or within about 0.2% to 2.0% of the maximum charge or discharge current. In some embodiments, time is measured to a precision on the order of about 10 microseconds to 10 milliseconds. As the unique identification of a battery user or a device may depend on the accuracy of recorded parameter values, the precision of the recorded metrics is not intended to be limiting.

D. Examples of Parameter Types

1. Static—Some parameters are "static" in the sense that they are evaluated or used only for their contribution at one point in the battery's life. They may be viewed as a snapshot taken during the battery's life. In some embodiments, a battery use signature is static, representing a group of battery parameters taken at one time, e.g., during a single charge event or at the beginning of a charge procedure.

Within the concept of static parameters are parameters that vary as a function of the state of charge. In such cases, the static parameter values may take the form of a vector or other ordered set of values, each associated with a particular state of charge over the course of a single charge cycle. In some contexts, such parameters might be considered "dynamic," but generally, as used herein, such parameters will be deemed static.

2. Dynamic—Dynamic parameters may be represented as a trajectory of parameter values over a time range associated with the life and use of a battery. Time may be quantified in various ways such as by duration (e.g., hours, days, etc.), cycles or fraction of cycles, state of health, age of the battery, range or level of SOC, etc. The trajectory of a dynamic parameter may be represented in various ways such as by a plot of parameter value versus time, an equation that fits the parameter values over time, or by certain properties of the trajectory such as maximum parameter value, minimum parameter value, maximum slope, minimum slope, total time (e.g., measured in cycle count), etc. It should be understood that all battery parameters, whether they are for adaptive charging or analytics, are captured at discrete time steps. In some implementations, these time steps are associated with each battery charge cycle. Of course, there are other options such calendar dates, certain numbers of days the battery is in service, events relevant to the battery such as when it is charged or discharged above a certain rate, when its temperature exceeds a particular level, etc.

Examples of trajectories that may form part of a battery use signature include variations in charge pulse voltage, partial relaxation time within each cycle and from cycle to cycle. Impedance trajectory may also be used. Still, other examples include charge time at a given SOC and variations in diffusion coefficient or diffusion time. In some implementations, the battery use logic records a trend in the number or frequency of corrections or adjustments that an adaptive charging procedure makes over the life of the battery, typically every cycle or partial charge cycle. Additionally, the logic may record a change in the charge pulse voltage and/or relaxation time over the life of the battery. For example, the rate of change in charge pulse voltage or impedance, with each cycle, may be part of a battery use signature.

Figure 2B:
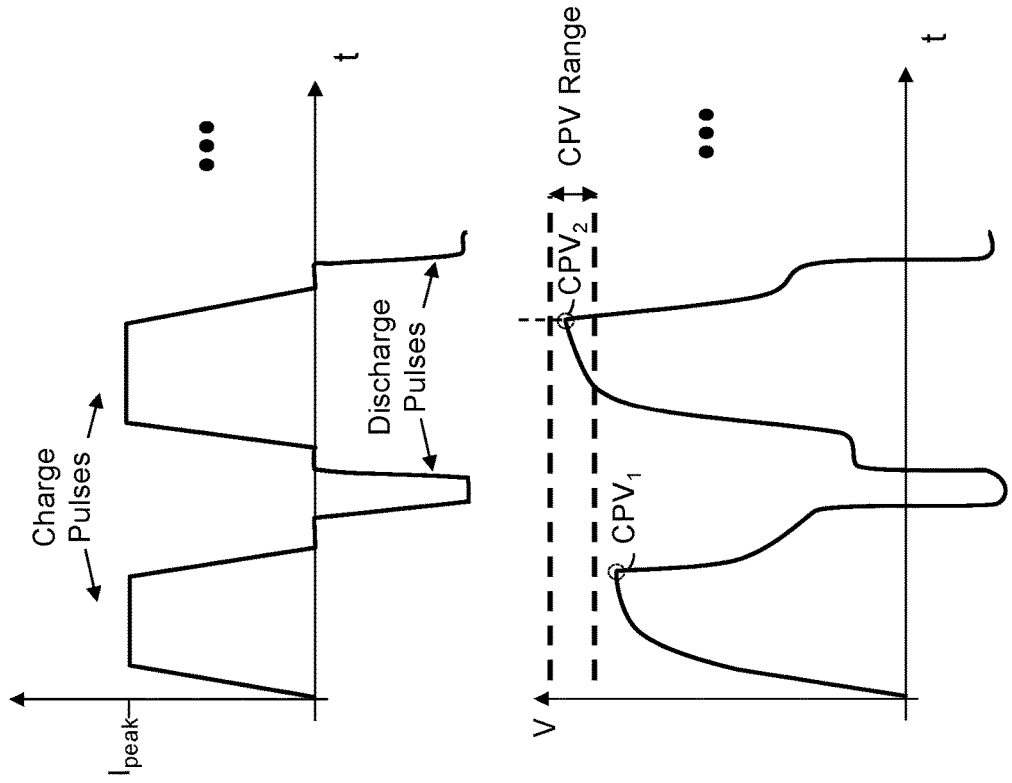
FIGS. 2A and 2B illustrate a change over a charge cycle in the charge pulse voltages $CPV_1$ and $CPV_2$ in response to a charge or discharge pulse. The change may be analyzed to determine, detect, calculate, estimate, and/or measure battery parameters such as the SOC of the battery. Battery control logic may determine a range of optimal charge pulse voltage values (CPV Range) and make adjustments to the charging procedure based upon how CPV values relate to the CPV range. In these figures, $CPV_1$ is shown to below the predetermined CPV Range while $CPV_2$ falls within the acceptable range. In this example the CPV range is the same for consecutive charge cycles, however, the predetermined CPV range may vary between charge cycles.
Figure 2A:
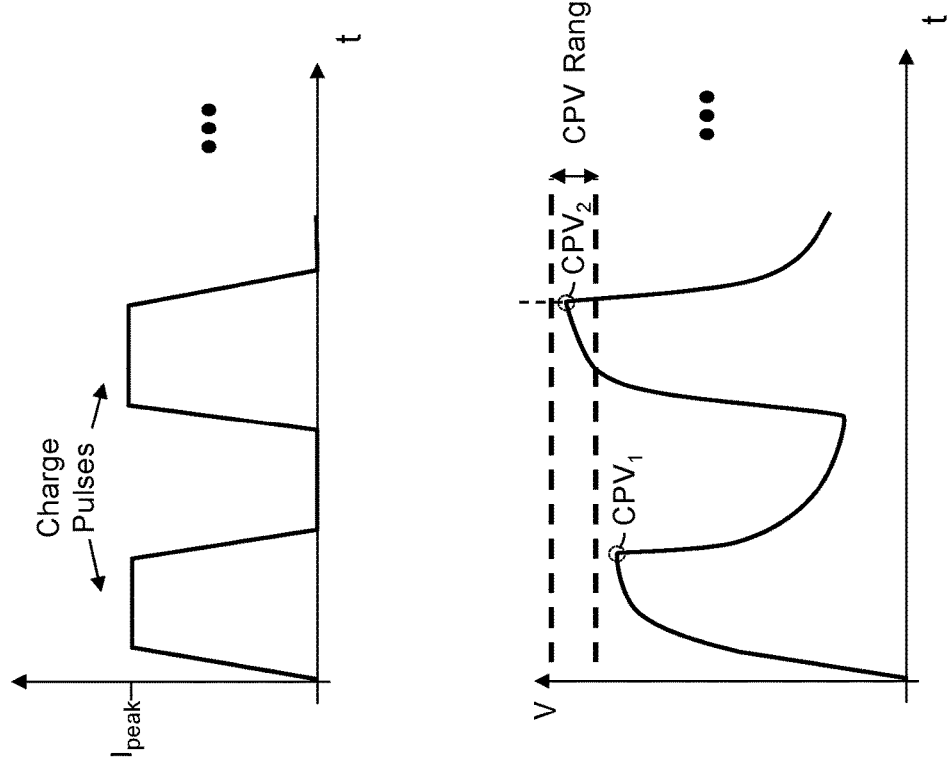
Figure 3A:
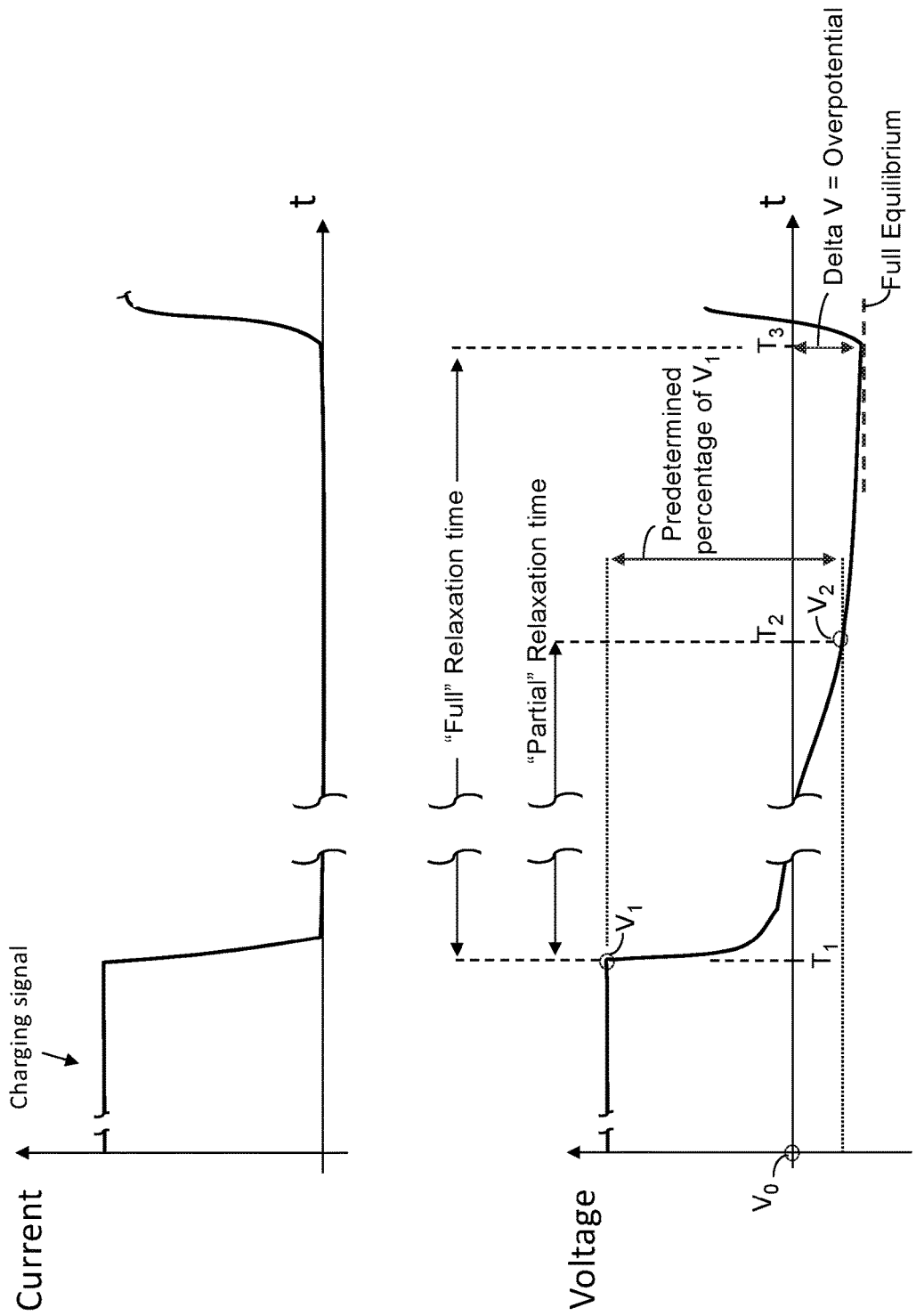
FIG. 3A illustrates an exemplary charge signal (which may include a plurality of charge packets and/or discharge packets—each packet having one or more charge pulses and/or one or more discharge pulses and an exemplary terminal voltage response of the battery to such charge signal wherein a first voltage ($V_1$) is identified (which correlates to the voltage of the battery at the end/termination of the charge signal) at time $T_1$ and a second voltage ($V_2$) at time $T_2$ is identified (which correlates to a predetermined percentage of voltage $V_1$) wherein the control circuitry may determine the overpotential or "full" relaxation time of the battery based on or using the form, shape and/or rate of decay of the terminal voltage; the predetermined percentage is preferably greater than 50% and, more preferably, between 60% and 95%). The duration between $T_1$ and $T_2$ is referred to as the partial relaxation time, while the duration between $T_1$ and $T_3$ is the time for the terminal voltage to reach full equilibrium or the full relaxation time. The overpotential is the difference between the terminal voltage of the battery just prior to applying a charge signal $V_0$ and the terminal voltage of the battery when the battery is at full equilibrium.

3. Examples—The following examples of battery parameters may be suitable for use in generating battery use signatures. They may be captured at any one or more battery cycles. In certain embodiments, these parameters are captured while the battery is in use such as while the battery is charging or discharging. In certain embodiments, they are captured at each battery cycle or at a substantial fraction of the battery cycles, e.g., at least about 50% of the battery cycles, or at least about 70% of the battery cycles, or at least about 90% of the battery cycles.

a) Charge Pulse Voltage (CPV)—The CPV may be characterized as (i) a peak voltage, measured at the terminals of the battery, which is in response to a charge pulse and/or (ii) a substantial peak voltage (i.e., within 5-10% of the peak voltage), measured at the terminals of the battery, which is in response to a charge pulse. FIGS. 2A and 2B illustrate charge pulse voltages in the voltage response curve resulting from charging and discharging pulses to the battery. As illustrated, a CPV may be determined after a single charge pulse, a train of two or more positive charge pulses, a train including at least one positive charge pulse and at least one negative charge pulse, etc.

b) Charge pulse voltage range or reference (CPV Range)—Predetermined values or a range of values of CPV that are targeted for optimizing charging conditions. FIGS. 2A and 2B illustrate charge pulse voltages in the voltage response curve resulting from applying charging and discharging pulses to the battery. In both figures, the first charge pulse voltage ($CPV_1$) falls out of the desired CPV range while the second charge pulse voltage ($CPV_2$) lies within the desired range. The CPV reference is useful in deciding whether and how to invoke adaptive charging.

c) Overpotential—The overpotential may be characterized as the voltage difference between the terminal voltage of the battery just prior to applying a charge signal and the terminal voltage of the battery when the battery is at full equilibrium (which may be characterized as when the terminal voltage of the battery is substantially or relatively constant or unchanging under no charging current-which, for a conventional lithium-ion battery, is typically after a temporal duration of, for example, about 1 to 2,000 seconds). FIG. 3 illustrates the overpotential (Delta V), which is measured from the potential of the battery just prior to application of the charge signal ($V_0$) after reaching a state of equilibrium.

d) Full relaxation time (FRT)—A duration characterized by the time it takes the terminal voltage of a battery to be deemed unchanging or substantially constant upon removal of a charge signal—typically a duration of 1 to 2,000 seconds. FIG. 3A illustrates the FRT, which is the duration between when the charge signal is removed at ($T_1$) and the terminal voltage of the battery reaches full equilibrium at ($T_3$).

Figure 3B:
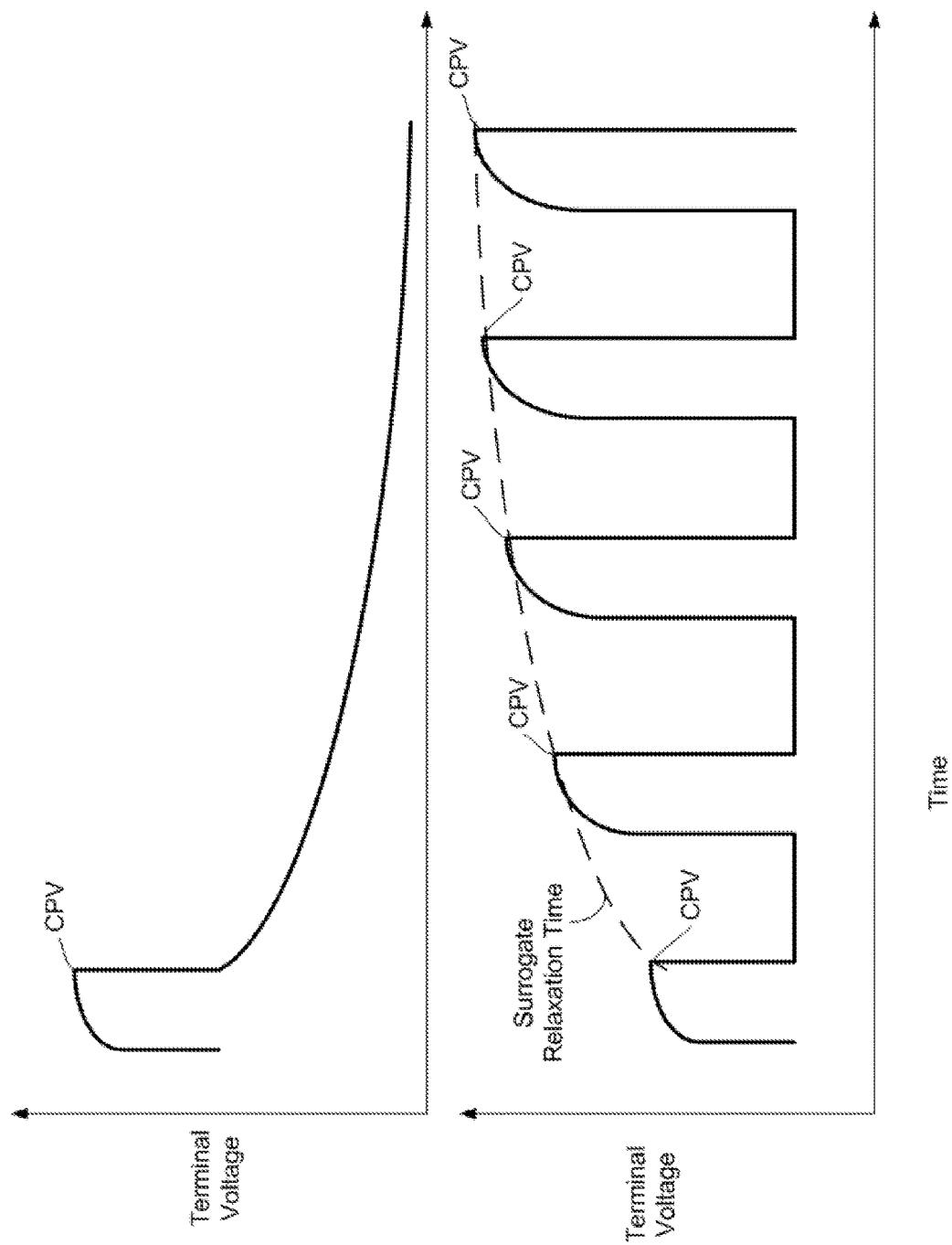
FIG. 3B illustrates the progression of CPV increase over the state of charge during a particular charge cycle. As shown, CPV trajectory of a charge pulse train is a mirrored image of the voltage decay if one stops charging and simply waits for minutes or tens of minutes. With the surrogate measure, one can continue to apply charge pulses to a battery, as with a conventional adaptive charging algorithm, and simply measure the time until the CPV reaches an approximately steady value.

In some embodiments, a surrogate measure of full relaxation time is used. In this approach, the charging need not be interrupted, or need be only minimally interrupted. It employs the series of charge pulses, as employed in a normal charge process, but it measures the change in CPV after each pulse; i.e., a CPV trajectory over time. FIG. 3B illustrates this trajectory in a typical example illustrating the progression of CPV increase over state of charge during a particular charge cycle. The upper panel represents a conventional way of measuring full relaxation time. After a charge pulse, the charge process is interrupted and time is spent waiting for the terminal voltage to decay to a steady value. The lower panel illustrates the surrogate method for determining full relaxation time. As shown, CPV trajectory of a charge pulse train is a mirror image of the voltage decay if one stops charging and simply waits for minutes or tens of minutes. With the surrogate measure, one can continue to apply charge pulses to a battery, as with a conventional adaptive charging algorithm, and simply measure the time until the CPV reaches a steady value.

e) Partial relaxation time (PRT)—A measurement characterized by the temporal difference corresponding to immediately after terminating a charge or discharge pulse and the time when the terminal voltage reaches a predetermined value (for example, preferably less than 10% of peak deviation and, more preferably, less than 5% of peak deviation) after two charging pulses are passed to the battery. FIG. 3 illustrates an example of measuring the PRT in which the measurement is determined as the difference in time between when charge signal is removed at ($T_1$) and the terminal voltage of the battery reaches a predetermined percentage of the terminal voltage ($V_1$) at the time ($T_2$).

f) Full charge capacity—As explained, the capacity of a battery is a measure of the amount of charge that a battery can hold when fully charged. It may be measured as the charge required to fully charge the battery from a fully discharged state or some other defined discharge state. In some embodiments, the fully charged and the cut-off discharged states are marked by particular battery voltages associated with full charge and cut-off discharge.

g) Projected capacity—The capacity may be the actual capacity measured for a given cycle or the capacity projected for a current cycle or some future cycle. The projected capacity may be determined using an analytic procedure such as those described in U.S. Pat. No. 8,970,178, issued Mar. 3, 2015, and incorporated herein by reference in its entirety.

h) Charge event information. A charge event is a portion of a battery cycle, starting at the time when a charge current is first applied to the battery and ending at the time when the charge current is removed. Information is collected over time bracketed between when charge is initially applied and when charge is removed. Various types of battery parameter information may be captured during a charge event. Examples include the starting state of charge, the ending state of charge, a timestamp (identifying when the charge current was first applied), a maximum temperature, a minimum temperature, a maximum voltage, a minimum voltage, an ending voltage during the charge event, a fixed or average charge current, a charge current profile (shape and duration of charge pulses) requested by the adaptive charging circuitry, and a comparison of the charge current profile to that of an earlier charge cycle. Charge event information, as well variations in charge event information over time, may indicate battery type, state of health, user behavior, etc.

i) Discharge event information. A discharge event is a portion of a battery cycle, starting when the charge current was removed and ending when the charge current is next reapplied to the battery. Examples of information captured during the discharged event include the starting state of charge, the ending state of charge, and optionally all or nearly all the parameters used for the charge event with the exception of the requested charge. Discharge event information is typically indicative of user behavior. For example, if a user of a mobile device routinely leaves a display on, frequently watches video, or uses computationally intensive applications, the discharge event information will record a pattern of increased power or current draw from the battery. Similarly, the discharge event in an electric vehicle may be indicative of whether a vehicle is used for driving at highway speeds or commuting through heavy city traffic.

j) Time in service. The time duration starting to when the battery was first installed in the device it powers, or optionally when it was first used, to the time at which the measurement is recorded.

k) Detrimental event parameters. These parameters quantified at levels, which if exceeded, will deteriorate a battery's state of health. Detrimental event parameters include but are not limited to charging at high temperatures, maintaining a high state of charge at a high temperature, and rapid discharging at a low temperature. The temperature, charging rates, and/or discharging rates identified to be detrimental will depend on the size, type, and application of a battery. For example, a battery used for a mobile device will have detrimental event parameter values that differ from a battery used to operate a drone or an electric vehicle.

One example of a detrimental event parameter is fast charging of the battery of a mobile device such as a smartphone during a single cycle at an average rate of at least about 1 C at a temperature of less than about 15 degrees Celsius. Another example is holding a smartphone battery at state of charge of at least about 95% at a temperature of at least about 40 degrees Celsius. Yet another example is discharging a smartphone battery during a single cycle at an average rate of at least about 1 C at a temperature of at least about 30 degrees Celsius. Of course, other ranges or thresholds of detrimental treatment will apply for other types of batteries or applications or even for other smartphones.

l) State of Health. As mentioned previously, the state of health of a battery characterizes the "age" of a battery and is indicative of the battery's performance and functional lifetime. The state of health parameter may be derived from or used in conjunction with any of the previously mentioned parameters, (a) through (k), and optionally the battery type (which may be determined from the battery use signature or provided by the user or device that the battery is installed into). In some embodiments the state of health parameter is used dynamically; i.e., it depends on the previously recorded state of health measurements, providing a historical data of the battery's functionality. For example, if there is a significant change in any of the previously mentioned parameters it may be indicative of a problem such as a leak of battery electrolyte. The state of health parameter may be expressed in a number of formats, for example, it may be expressed by a single value, an array of values, or a matrix of values. In some cases, a state of health parameter may be presented to a user so that the user is aware of destructive battery use behavior and/or knows if a battery needs to be replaced. As mentioned, the state of health parameter is described in U.S. Pat. No. 9,121,910, issued Sep. 1, 2015, which was incorporated herein by reference.

Processing of Parameters for Battery Use Signatures

A. Each user (or battery type or user/battery type combination) represents a point in a multidimensional parameter space. In certain embodiments, many or all users (or battery type or user/battery type combination) can be reliably separated from one another by distances between points associated with the users.

B. Alternatively, or in addition to simply identifying users by their battery use signature's position in multidimensional battery parameter space, battery use logic may produce a score based on parameter values with weights applied to individual parameter values. For example, the score may be a weighted summation of selected individual battery parameters. Other functions of the parameters, such as non-linear functions, may be used to obtain a score. Still, other examples include artificial intelligence routines as known to those of skill in the art to uniquely identify individuals by their Internet web browsing behavior. With increasing numbers of battery use parameters, the probability of uniquely identifying users rapidly increases.

C. In some embodiments, principal component analysis or a similar technique for identifying data variance is applied to a data set containing parameter values for multiple users. The principal components of the dataset define vectors of maximum variation through the multidimensional parameter space. Each dimension (associated with a parameter) of the vector will have an associated coefficient representing its linear contribution to the variance. These coefficients may be used to determine weights associated with parameters to prepare a score.

D. The number of battery use parameters included in a signature or used in a relationship defining a signature depends on the ability of chosen parameters to distinguish users from one another or serve another requirement. In certain embodiments, the signature or relationship for generating the signature employs at least about 5 battery use parameters, or at least about 10 battery use parameters.

Figure 7:
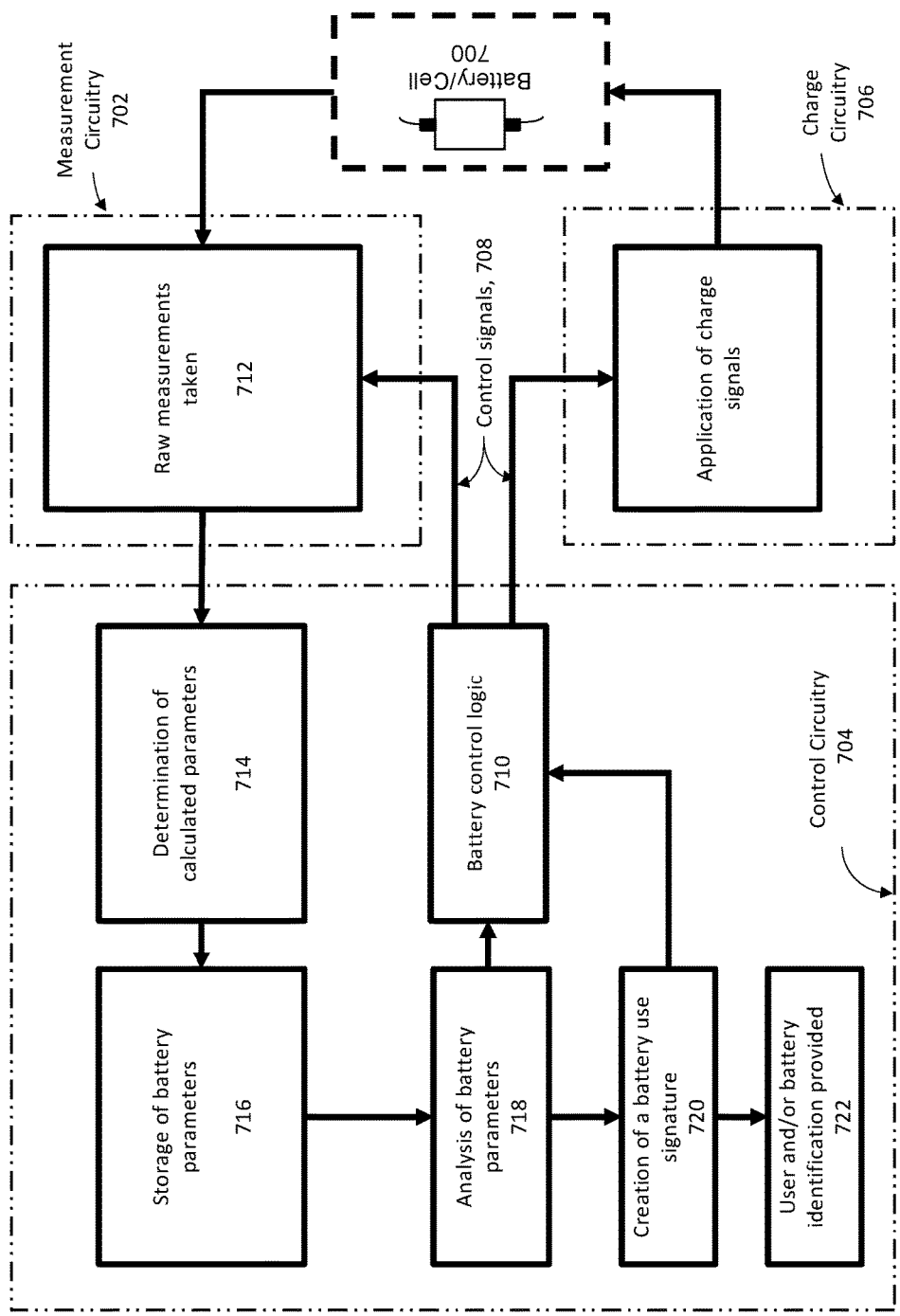
FIG. 7 is a block diagram illustrating one possible process for capturing, processing, and utilizing collected battery parameters in the apparatus comprising the control circuitry, measurement circuitry, and charge circuitry.

FIG. 7 illustrates a process for capturing and using battery parameters of a battery 700 using a measurement circuitry 702, control circuitry 704, and charge circuitry 706. Battery control logic 710 determines charging and measurement parameters. These parameters are sent via control signals 708 to the charge and measurement circuitry. Raw battery measurements taken 712 by the measurement circuitry include but are not limited to temperature, voltage, current, charge passed, and time. Raw battery measurements may be passed back to the control circuitry where parameters such as SOC, SOH, overpotential, and PRT may be determined 714 from the raw battery measurements. In some cases, measurements such as a battery's SOC may be determined directly by measurement circuitry. Raw and processed parameters may then be stored locally or on a remote server 716 where they may be further analyzed 718 and fed into the battery control logic or scored to form a battery use signature 720. The analyzed data in conjunction with prior data of the battery is then fed back into the battery control logic 710 to allow for an adaptive charging. Battery use signatures may be used to provide user identification or a battery type identification 722. Battery parameters may be processed on the device comprising the battery or on a remote server. In some cases, logic execution and user or battery type identification may take place on the device itself and in some cases, logic execution and user or battery type identification may take place at a remote location.

In certain embodiments, user identification proceeds according to the following sequence: determining that it is time to measure a battery parameter value; automatically measuring raw battery parameters (e.g., temperature, charge passed during the current charge or discharge event, voltage, current, and time); determining battery parameter values from the measured information; storing the parameters; organizing and/or transforming the parameters (e.g., into a score or other unique form of battery use signature); and/or analyzing the battery use signature to provide a user identification and/or a battery type identification.

In certain embodiments execution of logic for identifying a user or battery comprises use of battery parameters as well as one or more non-battery parameters. Non-battery parameters are parameters that are determined independently of the battery and are provided by the device or the user. Examples of non-battery parameters include the international mobile station equipment identity (IMEI) of a mobile device, location data provided by the device (e.g. data from GPS, or other network triangulation positioning logic), sensed information by the device (e.g. data collected by a accelerometer, gyroscope, pressure sensor, temperature sensor, microphone, camera, or fingerprint sensor), and any personalized information provided by the user (e.g. age, occupation, residence, security questions, etc.).

Apparatus

The apparatus used to collect battery parameter values and/or determine a battery use signature may have many configurations. In some cases, all or most of the battery parameter values are collected by a single module or circuit, while in other cases, the parameter values are collected by multiple modules and/or circuits. Battery monitoring circuits and/or charging circuits may be used for this purpose. Additionally or alternatively, battery control logic, whether operating alone or in conjunction with battery monitoring and/or charging modules or circuitry, may be used to collect the parameter values. In certain embodiments, the parameter values are collected by a module, circuit, or logic that is directly connected to a battery such as a circuit or a module that is physically attached to, mounted on, or encased in an electronic device housing the battery. In other embodiments, the parameter values are collected by a module, circuit, or logic that is located away from the battery and/or the electronic device powered by the battery. For example, the module, circuit, or logic may be coupled to the battery and/or device by a wired or wireless link.

The apparatus used to generate a battery use signature, identify a user, and/or discriminate between two or more users may be the same apparatus used to collect the battery parameter values or may be distinct apparatus such as a mobile device, a server, or a distributed collection of remote processing devices. In some implementations, the cloud is used to determine the battery use signature, identify a user, and/or discriminate between two or more users. In certain embodiments, the apparatus used to collect battery use parameters and/or use them for user identification is also used to adaptively charge a battery.

Charging and/or monitoring circuitry typically contains at least two terminals. Illustrated in FIG. 4, an example of suitable apparatus comprises charging circuitry (12) responsive to control signals, to generate a charge signal which is applied to the terminals of the battery, where the charge signal may include a plurality of charge packets, which may each include one or more charge pulses. The apparatus may also include measurement circuitry (14), coupled to the battery, to measure a plurality of voltages and/or other battery parameter values for generating a battery use signature. The battery parameter values and/or battery use signature may be stored and analyzed on a remote server or cloud-based application. The apparatus also includes control circuitry (16), coupled to the charging circuitry and the measuring circuitry. The control circuitry is configured to generate one or more control signals to adapt one or more characteristics of a charge packet in the context of adaptive charging. The control circuitry may also play roles in monitoring battery performance, collecting battery parameter values, generating battery use signatures, and/or identifying users or discriminating between two or more users.

Charge Circuitry

Figure 5A:
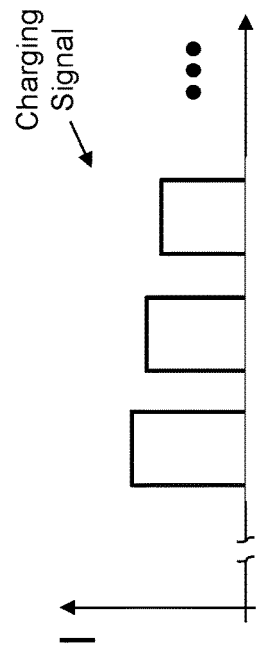
FIGS. 5A-5D illustrate exemplary waveforms illustrating a plurality of exemplary charging signals and discharging signals of an exemplary charging technique, wherein such charging signals may generally decrease according to a predetermined rate and/or pattern (for example, asymptotically, linearly or quadratically) as the terminal voltage of the battery increases during a charging or recharging sequence, operation or cycle (see, FIGS. 5B and 5D); notably, a charging or recharging sequence, operation or cycle may include charging signals (which, in total, inject or apply charge to the battery) and discharging signals (which, in total, remove charge from the battery).
Figure 5B:
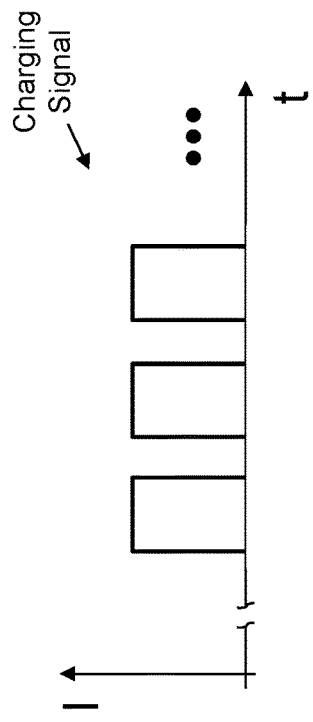
Figure 5C:
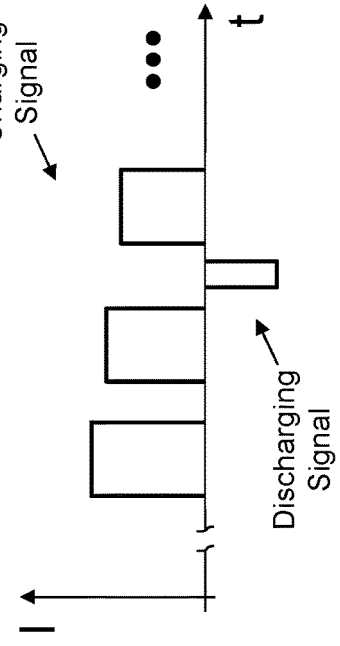
Figure 5D:
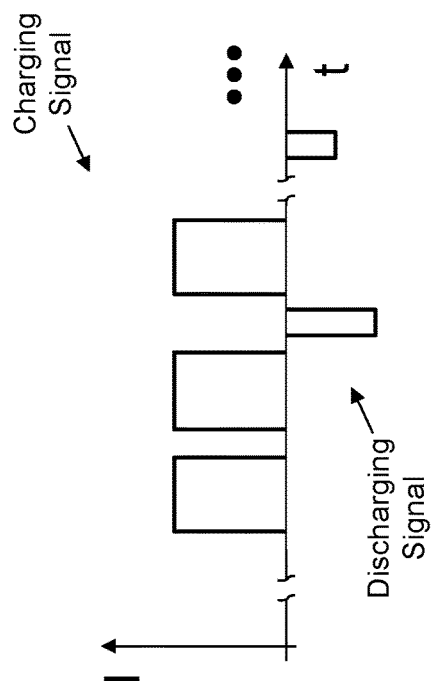

In one embodiment, charging circuitry responsively applies one or more current or charging signals to the battery. (See, for example, FIGS. 5A and 5B). The charging circuitry may also apply one or more charging signals (which provide a net input of charge or current into the battery) and one or more discharging signals (which provide a net removal of charge or current from the battery). (See, for example, FIGS. 5C and 5D).

The adaptive charging circuitry and techniques may employ any charging circuitry, whether described herein, now known or later developed, to charge the battery; all such charging circuitry are intended to fall within the scope of this disclosure. For example, charging circuitry may generate charging and discharging signals, packets, and pulses (as described herein). Notably, charging circuitry is generally responsive to control signals from the control circuitry.

With reference to FIGS. 6A-6J, the charging and discharging signals may include a plurality of charge packets wherein each charge packet includes one or more charge pulses and, in certain embodiments, one or more discharge pulses. The charging and discharging signals may also include one or more discharge packets wherein each discharge charge packet includes one or more discharge pulses. (See, FIGS. 6K-6N). Indeed, the charging and discharging signals may also include charge packets and one or more discharge packets wherein each charge packet and discharge packet include one or more charge pulses and/or one or more discharge pulses. (See, FIGS. 6K and 6N).

Discharge signals remove charge from the battery and may be employed to reduce the time period for the battery terminal voltage to return to equilibrium. In this regard, the discharge period may remove excess charge that has not diffused into the anode, and thus may, for example, contribute to degradation mechanisms, examples include the thickening of the solid-electrolyte interface (SEI) layer or metallic plating of lithium. Clearly, the difference between the electrical charge added to the cell during the charging period and the electrical charge removed from the cell during the discharge period determines a net total electrical charge added to the cell in one period. This net total electrical charge divided by the period may determine a net effective charging current. All combination or permutations of charging signals and discharging signals are provided by the charge circuitry and are intended to fall within the scope of the present disclosure.

Monitoring Circuitry

Figure 4:
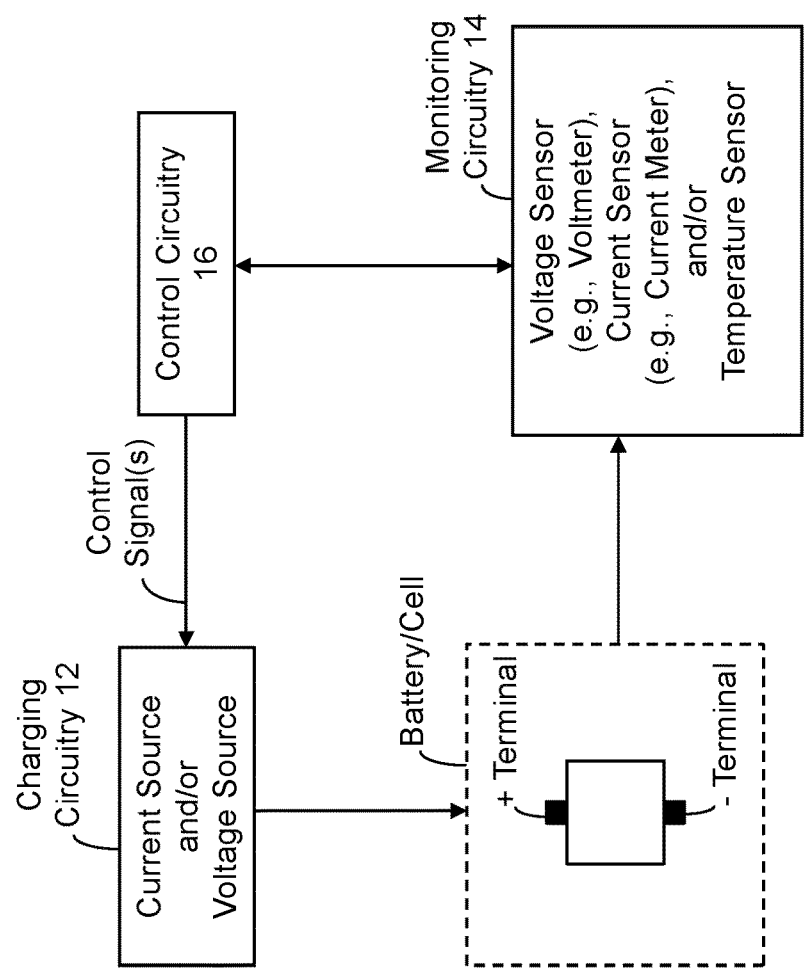
FIG. 4 illustrates, in block diagram form, exemplary adaptive charging circuitry in conjunction with a battery (which may include two terminals (for example, positive and negative terminals), according to at least certain aspects of certain embodiments of the present disclosures, wherein in this embodiment, the charging circuitry may include voltage source and/or current source, and the monitoring circuitry may include voltage, current, and/or temperature sensors (for example, a voltmeter and/or a current meter)

With continued reference to FIG. 4, monitoring circuitry measures, monitors, senses, detects and/or samples, on an intermittent, continuous and/or periodic basis, condition or characteristics of the battery including, for example, the terminal voltage, open circuit voltage (OCV), voltage response of the battery to one or more charge pulses, and/or temperature of the battery. In one embodiment, the monitoring circuitry includes a sensor to determine a voltage (for example, a voltmeter) and/or a sensor to determine a current (for example, a current meter). The monitoring circuitry provides data which is representative of the condition or characteristics of the battery to the control circuitry. Moreover, the monitoring circuitry may include one or more temperature sensors (not illustrated) which is/are thermally coupled to the battery to generate, measure and/or provide data which is representative of the temperature of the battery. The monitoring circuitry and techniques may be those described herein, now known or later developed, to acquire data employed by the control circuitry to adapt the charging profile of the battery; all such monitoring circuitry and techniques are intended to fall within the scope of this disclosure.

Control Circuitry

In certain embodiments, the control circuitry, using data from monitoring circuitry, calculates, determines and/or assesses the state or condition of the battery in connection with the charging or recharging process. For example, control circuitry calculates, determines and/or estimates a change in terminal voltage of the battery in response to charge or current applied to or injected into the battery. The control circuitry may also calculate, determine and/or estimate one, some or all of the SOC of the battery, SOH of the battery, partial relaxation time of the battery and/or overpotential or full relaxation time of the battery.

The control circuitry also calculates, determines and/or implements a charging sequence or profile based on or using one or more of the adaptive charging techniques and algorithms. In this regard, control circuitry adapts, adjusts and/or controls one or more characteristics of the charge or current applied to or injected into the battery (via controlling the operation of charging circuitry) so that the change in terminal voltage of the battery (in response to charge or current applied to or injected into the battery during a charging or recharging sequence/operation) is within a predetermined range and/or below a predetermined value. In this regard, each of the charge signals, discharge signals and rest periods may be adapted to control and/or manage the relaxation time of the cell of the battery. In addition to adapting the sequence of the charge signals, discharge signals and rest periods—in relation to each other—the control circuitry may vary, adjust and/or control one or more of the variable characteristics of the charge signals, discharge signals and rest periods. In this way, the control circuitry may obtain or provide a desired or predetermined relaxation time or period (for example, a relaxation time that is within prescribed range), by adjusting and/or controlling the amount of electrical charge removed during the discharge period (by, for example, controlling the characteristics of the discharge signal(s) and/or period), the amount of electrical charge added during the charge period (by, for example, controlling the characteristics of the charge signal(s) and/or period), and/or the characteristics of the rest period. In one embodiment, the adaptive charging technique or algorithm employs a sequence of discharge signals where the relaxation time is calculated, determined and/or measured after each of the discharge signals. In this way, the control circuitry may adaptively determine the total amount of electrical charge that should be removed (and, in response thereto, control the charging circuitry accordingly).

There are numerous permutations involving the amount of electrical charge added to the battery during the charge or charging signal and the amount of charge removed during the discharging signal. All permutations are intended to fall within the scope of the present disclosure. Notably, each permutation may result in a different relaxation period. Moreover, within each permutation, there exists a large number of sub-permutations that i) combine the characteristics of the charge or charging signals (for example, the duration, shape and/or amplitude of the charging signal), the product of which determines the amount of electrical charge added to the cell; and ii) combine the characteristics of the discharging signal (for example, the duration, shape and/or amplitude of the discharging signal), the product of which determines the amount of electrical charge removed from the cell; and iii) the length of time of the rest period. The characteristics of the charge or charging signals may differ from the characteristics of the discharging signals. That is, one or more of the duration, shape and/or amplitude of the charging signal may differ from one or more of the duration, shape and/or amplitude of the discharging signal.

Notably, control circuitry may include one or more processors, one or more state machines, one or more gate arrays, programmable gate arrays and/or field programmable gate arrays, and/or a combination thereof. Indeed, control circuitry and monitoring circuitry may share circuitry with each other as well as with other elements; such circuitry may be distributed among a plurality of integrated circuits which may also perform one or more other operations, which may be separate and distinct from that described herein. In some embodiments, control circuitry may be housed within a device containing the battery. Alternatively, a battery may be housed in an electronic device, while control circuitry may be housed elsewhere. For example, control circuitry may operate on a remote server or a cloud-based application. In some cases, control circuitry may be coupled to monitoring circuitry and/or charging circuitry via wireless or wired communication. In some cases, control circuitry may be configured to store identified parameter values on a remote server, and in some cases, control circuitry algorithms may be updated by a user.

Control circuitry may perform or execute one or more applications, routines, programs and/or data structures that implement particular methods, techniques, tasks or operations described and illustrated herein. The functionality of the applications, routines or programs may be combined or distributed. In addition, the applications, routines or programs may be implementing by control circuitry using any programming language whether now known or later developed, including, for example, assembly, FORTRAN, C, C++, and BASIC, whether compiled or uncompiled code; all of which are intended to fall within the scope of the present disclosure.

Applications for Battery Use Signatures

A. Determining when a Battery has been Changed in a Device

This application is useful in detecting fraud on an equipment manufacturer. By analyzing a battery use signature, it may be possible to determine if and when an original battery was replaced for a substitute battery. Often equipment is sold with a warranty binding the manufacturer to refund the purchase price or replace the equipment when a battery dies prematurely. Knowing this, a defrauding user might purchase equipment, replace its original battery with a used and/or defective battery, and return the equipment to the manufacturer and request action under the warranty. In another scenario, an expensive peak-shaving battery system for energy storage purposes might have its warranty voided when a user employs unauthorized service personnel, who may replace a high-quality battery in the system with an inferior product. Further, the utility company may charge the end user or the system provider if the peak-shaving system fails to perform as required during a peak power period. For example, the battery system may not deliver as much charge or power as required for effective peak shaving. This may trigger an action by the utility against the end user or the manufacturer of the system.

1. Review Time-Varying Information Over a Battery's Life

As described herein, the battery logic in a device stores battery parameters that reflect battery use. Parameters are collected in a series of snapshots acquired at different times, such as each time the user charges the battery. After a battery is changed, or when a new user takes control of a device, the time-varying signature of the battery will exhibit a discontinuity or other detectable change. For example, in some cases, a user may replace the battery on the electronic device. Before the battery is changed, a battery use signature reflects the use of the initial battery (e.g., one sold with the device) and personal usage patterns of that user. After the battery is changed, subsequently captured battery parameters reflect the use of a different battery. Over time, the new battery will develop a battery use signature that can be analyzed to determine that a battery change has occurred while the user has remained the same. In another example, an electronic device acquires a new user (e.g., a mobile phone is sold to a new user) and the battery use signature reflects the point at which the transition occurred by distinguishing between the prior user's and new user's habits. Whenever there is a change in battery or battery use, the stored snapshots of battery parameters may exhibit a detectable variation at the time of the change.

It should be understood that the battery logic, which stores the parameters used to provide a battery use signature, does not capture use parameters while the user of the replacement battery was using that battery on a different device. Before and after the replacement, the device captures battery parameters caused by the device owner. However, after the change, the parameters reflect use by the both the prior user and the device owner. Thus, the battery use signature might suddenly, at the time of the replacement, exhibit a significant change.

2. Snapshot at the Time of the Battery Change

A snapshot of the battery's performance when it is replaced, or at the first cycle after it is replaced, can contain a signature of the prior user's user pattern, which can be discriminated from the device owner's pattern. While some aspects of a battery owner's use pattern are reflected only in a time-varying signature, other aspects of the pattern are reflected in static information; i.e., a snapshot of information taken during the cycle immediately after the battery is replaced. This snapshot will contain a signature that can be clearly distinguished from that of the device owner.

B. Security and Other User Identification Applications

The United States NSA, CIA, FBI, and other government security institutions can identify individuals by virtue of their use signature captured in a product that contains a battery. In some embodiments, the institution can identify a user by his or her battery usage signature. For example, a security agency can analyze a battery use signature in a mobile phone to identify a particular user of the phone to establish that the user possessed the mobile phone and made certain calls or accessed certain information at a certain time.

As an example, an identification process can start by identifying from intrinsic battery use parameters such as CPV, PRT, etc., the type of battery, and consequently the device type since mobile device models are uniquely associated with their battery; e.g., a certain battery type is unique to Apple's iPhone 6S. Time stamps can also be used to narrow down the geography, along with ambient temperature profiles of the battery. Usage patterns of power draw from the battery can further narrow it down to the type of applications used; e.g., video versus SMS, and consequently begin to profile the age group of the user.

Additional Embodiments

It should be noted that the circuitry of the present disclosure may include and/or employ the control/processing circuitry, monitoring circuitry and/or charging circuitry described and illustrated in PCT Application Serial No. PCT/US2012/30618, U.S. application Ser. No. 13/366,352, U.S. application Ser. No. 13/626,605, U.S. application Ser. No. 13/657,841, U.S. application Ser. No. 13/747,914, all of which are incorporated herein by reference in their entireties. For the sake of brevity, the discussion regarding such circuitry, in the context of the techniques of the present disclosure, will not be repeated.

The memory which stores the data, equations, relationships, and/or look-up table may be a permanent, semi-permanent or temporary (i.e., until re-programmed) storage that is discrete or resident on (i.e., integrated into), for example, the control circuitry. As such, in one embodiment, the memory may be one time programmable, or data, equations, relationships, and/or look-up table employed by the control/processing circuitry may be one time programmable (for example, programmed during a test or at manufacture). In another embodiment, the memory is more than one time programmable and, as such, the predetermined values and/or band limits employed by the control circuitry may be modified after test and/or manufacture. For example, predetermined values and/or band limits may be modified by the control logic or by a firmware update.

In some embodiments, memory for storing data, equations, and relationships, battery parameters, and/or a battery use signature may be located on a battery unit. By having memory physically attached to a battery itself, it is possible to capture and record a battery's parameters even when the battery is used between multiple devices. For example, a battery enclosure may have memory that is permanently attached or memory that is detachable. In some cases physically attached memory may be configured to communicate with the device the battery is attached to via wireless communication, e.g., a battery may have an RFID with memory. In some cases, a battery may be configured with connection pins that may be used to transfer information to the device to which a battery is attached.

Many modifications, variations, combinations and/or permutations are possible in light of the above teaching. For example, although the exemplary embodiments and/or techniques are described and/or illustrated in the context of circuitry for and techniques for a lithium-ion technology/chemistry based battery/cell (for example, lithium-cobalt dioxide, lithium-manganese dioxide, lithium-iron phosphate, and lithium-iron disulfide), the concepts described and/or illustrated herein may also be implemented in conjunction with other electrolyte battery/cell chemistries/technologies having anode(s) comprised of aqueous or non-aqueous electrolytes, and various anode and cathode materials. Examples of anode materials include "pure" silicon or silicon (or silicon alloys) and one more other materials including, for example, other silicon-carbon composite materials, tin alloys, and composite tin-graphite. Thus, it is to be understood that other embodiments may be utilized and operational changes may be made without departing from the scope of the present disclosure. As such, the foregoing description of the exemplary embodiments has been presented for the purposes of illustration and description. It is intended that the scope of the disclosure not be limited solely to the description above.

It should be further noted that the various circuits and circuitry disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats and/or languages now known or later developed. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits and circuitry, as well as techniques, disclosed herein may be represented via simulations using computer aided design and/or testing tools. The simulation of the charging circuitry, control circuitry and/or monitoring circuitry, and/or techniques implemented thereby, may be implemented by a computer system wherein characteristics and operations of such circuitry, and techniques implemented thereby, are imitated, replicated and/or predicted via a computer system. The present disclosure is also directed to such simulations of the inventive charging circuitry, control circuitry and/or monitoring circuitry, and/or techniques implemented thereby, and, as such, are intended to fall within the scope of the present disclosure. The computer-readable media corresponding to such simulations and/or testing tools are also intended to fall within the scope of the present disclosure.

Notably, reference herein to "one embodiment" or "an embodiment" means that a particular feature, structure, or characteristic described in connection with the embodiment can be included in one some or all of the embodiments of the present disclosure. The usages or appearances of the phrase "in one embodiment" or "in another embodiment" in the specification are not referring to the same embodiment, nor are separate or alternative embodiments necessarily mutually exclusive of one or more other embodiments. The same applies to the term "implementation." The present disclosure is neither limited to any single aspect nor embodiment thereof, nor to any combinations and/or permutations of such aspects and/or embodiments. Moreover, each of the aspects of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein.

Further, an embodiment or implementation described herein as exemplary is not to be construed as preferred or advantageous, for example, over other embodiments or implementations; rather, it is intended to convey or indicate that the embodiment or the embodiments are example embodiment(s).

In the claims, the term "determine" and "calculate" and other forms thereof (i.e., determining, determined and the like or calculating, calculated and the like) means, among other things, calculate, assesses, determine and/or estimate and other forms thereof.

Moreover, the phrase "determining a state of charge of the battery" and "calculating a state of charge of the battery" in the claims means determining, detecting, calculating, estimating, and/or measuring a state of charge of the battery and/or a change in a state of charge of the battery/cell. Similarly, the phrase "calculating a state of health of the battery" and "determining a state of health of the battery" in the claims means determining, detecting, calculating, estimating, and/or measuring a state of health of the battery and/or a change in a state of health of the battery/cell.

In addition, the terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item. Further, the term "data" may mean, among other things, a current or voltage signal(s) whether in analog or a digital form (which may be a single bit (or the like) or multiple bits (or the like)).

As used in the claims, the terms "comprises," "comprising," "includes," "including," "have," and "having" or any other variation thereof, are intended to cover a non-exclusive inclusion, such that a process, method, article, or apparatus that comprises a list of elements does not include only those elements but may include other elements not expressly listed or inherent to such process, method, article, or apparatus.

Further, the statement that one or more circuits, circuitry, nodes and/or components are "coupled" means that the circuits, circuitry, nodes and/or components are joined and/or operate (for example, physically or electrically) together either directly or indirectly, i.e., through one or more intermediate circuits, circuitry, nodes and/or components, so long as a link occurs; "directly coupled" means that two elements are directly joined, in contact and/or operate with each other.

What is claimed is:

1. A method for identifying or discriminating one or more persons having used a battery or an electronic device powered by the battery, the method comprising:
   a) tracking, by battery control logic implemented in one or more hardware processors, multiple battery parameter values representing electrical characteristics of the battery under the control of the battery control logic, the battery control logic being in the electronic device or a component associated with the electronic device; and
   b) analyzing, by the battery control logic, the battery parameter values tracked in
   (a) to
      (i) identify a person having used the electronic device or the component comprising the battery, and/or
      (ii) discriminate between two or more putative persons having used the electronic device or the component comprising the battery; wherein identifying multiple battery parameter values comprises measuring a battery terminal voltage over time, and, from the battery terminal voltage, calculating one or more of the following parameters: charge pulse voltage, overpotential, voltage response shape due to a charge or discharge pulse, full relaxation time, partial relaxation time, and equilibrium voltage measurements.

2. The method of claim 1, wherein the identified multiple battery parameter values comprise the number, frequency, current, and/or time stamps of charge cycles for a given battery/cell.

3. The method of claim 1, wherein the identified multiple battery parameter values comprise a state of charge history for the battery.

4. The method of claim 1, wherein the identified multiple battery parameter values comprise a temperature corresponding to the battery or external environment.

5. The method of claim 1, wherein the multiple battery identified parameter values comprise a capacity of a battery/cell identified as a function of time.

6. The method of claim 1, wherein the multiple battery identified parameter values comprise a state of health value of the battery.

7. The method of claim 1, wherein identifying multiple battery parameter values comprises measuring the current applied and/or the total charge passed to the battery.

8. The method of claim 1, wherein identifying multiple battery parameter values comprises capturing parameter values at a time after a battery's initial use of at least about 10 charge cycles.

9. The method of claim 1, wherein identifying multiple battery parameter values comprises capturing parameter values during each new charge cycle.

10. The method of claim 1, further comprising the identification of battery parameter values to create an adaptive charging profile to optimize a battery's cycle life and/or charge speed.

11. The method of claim 1, wherein analyzing the identified battery parameter values comprises generating a battery use signature from the identified battery parameter values.

12. The method of claim 11, wherein the battery use signature comprises data representing a history of captured battery parameters.

13. The method of claim 11, further comprising using the battery use signature to detect fraudulent warranty claims pertaining to the electronic device.

14. The method of claim 11, further comprising using the battery use signature to detect criminal activity pertaining to use of the electronic device.

15. The method of claim 1, further comprising using one or more of the battery parameter values to inform the person having used the battery user of the battery's state of health.

16. The method of claim 1, further comprising using one or more of the battery parameter values to predict a charge time of the battery.

17. The method of claim 1, wherein (b) further comprises analyzing at least one non-battery parameter.

18. The method of claim 17, wherein the at least one non-battery parameter includes an international mobile station equipment identity, location data provided by the electronic device, sensed information provided by the electronic device, or personalized information provided by the user of a remote device.

19. The method of claim 1, further comprising identifying a battery type of the battery by comparing the multiple battery parameter values to a database providing ranges of battery parameter values for a plurality of battery types.

20. The method of claim 1, wherein (b) comprises discriminating between an original battery and a replacement battery.

21. The method of claim 1, wherein identifying a person having used the battery or discriminating between two or more putative persons having used the battery in (b) comprises identifying one or more patterns indicating user behavior.

22. The method of claim 21, wherein the one or more patterns indicating user behavior include analysis of when charging occurs, the state of charge when charging is initiated, or the state of charge at which charging is stopped.

23. A method for identifying a user of a battery or an electronic device powered by the battery, the method comprising:
(a) measuring or receiving data representing battery parameter values representing characteristics of a battery under the control of battery control logic in an electronic device or a component associated with the electronic device, wherein the characteristics of a battery include at least five characteristics selected from the group consisting of the number, frequency, current, and/or time stamps of charge cycles for the battery, a state of charge history for the battery, a temperature corresponding to the battery or external environment, a capacity of the battery, a state of health of the battery, a charge pulse voltage of the battery, an overpotential of the battery, a voltage response shape due to a charge or discharge pulse applied to the battery, a full relaxation time of the battery, a partial relaxation time of the battery, and an equilibrium voltage measurements of the battery;
(b) computationally generating a battery use signature from the battery parameter values measured or received in (a);
(c) computationally using the battery use signature to
(i) identify a user of the device or the component comprising the battery, and/or
(ii) discriminate between two or more putative users of the device or the component comprising the battery; and
(d) detecting criminal activity and/or insurance information based on the identification and/or discrimination in (c); wherein identifying multiple battery parameter values comprises measuring a battery terminal voltage over time, and, from the battery voltage, overpotential, voltage response shape due to a charge or discharge pulse, full relaxation time, partial relaxation time, and equilibrium voltage measurements.

* * * * *